(12) United States Patent
Quinn

(10) Patent No.: US 6,514,788 B2
(45) Date of Patent: Feb. 4, 2003

(54) METHOD FOR MANUFACTURING CONTACTS FOR A CHALCOGENIDE MEMORY DEVICE

(75) Inventor: Robert M. Quinn, Bristow, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 09/867,120

(22) Filed: May 29, 2001

(65) Prior Publication Data

US 2002/0182835 A1 Dec. 5, 2002

(51) Int. Cl.$^7$ ............................................. H01L 21/00
(52) U.S. Cl. ........................ 438/95; 438/387; 438/602
(58) Field of Search ................................. 438/387, 945, 438/947, 95, 602, 702, 720, 767, 696

(56) References Cited

U.S. PATENT DOCUMENTS 5,851,882 A * 12/1998 Harshfield .................. 438/275
6,147,395 A * 11/2000 Gilgen ....................... 257/529

* cited by examiner

*Primary Examiner*—Caridad Everhart
(74) *Attorney, Agent, or Firm*—Antony P. Ng; Bracewell & Patterson, L.L.P.

(57) ABSTRACT

A method for manufacturing contacts for a Chalcogenide memory device is disclosed. A via is initially formed within a first oxide layer on a substrate. A conductive layer is then deposited on top of the first oxide layer. A second oxide layer is deposited on the conductive layer. Subsequently, the second oxide layer and the conductive layer are then removed such that the remaining portion of conductive layer within the via flushes with a surface of the first oxide layer. A third oxide layer is deposited on the conductive layer, and the first and second oxide layers. A pattern is formed to remove third layer so that the pattern opens orthgonally across and exposes the conductive layer. Next, a nitride layer is deposited on the third oxide layer, the conductive layer, and the first and second oxide layers. The nitride layer conforms with the contour of the third oxide layer. After directionally removing the nitride layer to form a spacer at the exposed edge of the third oxide layer, the third oxide layer is removed to expose the spacer. The conductive layer is then etched to remove a portion of the conductive layer not underneath the spacer. The portion of the conductive layer underneath the spacer resembles a matchstick. The spacer is then removed to expose the matchstick-like conductive layer portion with a small top surface contact area.

11 Claims, 6 Drawing Sheets

METHOD FOR MANUFACTURING CONTACTS FOR A CHALCOGENIDE MEMORY DEVICE

BACKGROUND OF THE INVENTION

1. Technical Field

The present invention relates to integrated circuits in general, and in particular to Chalcogenide memory devices. Still more particularly, the present invention relates to a method for manufacturing contacts for a Chalcogenide memory device.

2. Description of the Prior Art

The use of phase change materials that can be electrically switched between a generally amorphous first structural state and a generally crystalline second structural state for electronic memory applications is well-known in the art. Phase change materials may also be electrically switched between different detectable states of local order across the entire spectrum between the completely amorphous and the completely crystalline states.

Some phase change materials exhibit different electrical characteristics according to their state. For example, Chalcogenide materials exhibit a lower electrical conductivity in its amorphous state than it does in its crystalline state. The Chalcogenide materials for making memory cells are typically selected from the group of tellurium, selenium, antimony, and germanium. Such Chalcogenide materials can be switched between numerous electrically detectable conditions of varying resistivity in nanosecond time periods by using picojoules of energy. The resulting memory cell is truly non-volatile and will maintain the integrity of the stored information without the need for periodic signal refresh.

The operation of Chalcogenide memory cells requires that a region of the Chalcogenide memory material, called the Chalcogenide active region, be subjected to a current pulse with a current density typically between $10^5$ and $10^6$ amperes/cm$^2$. Such current density may be accomplished by making a small opening, such as a via or contact, in a dielectric material that is itself deposited onto a lower electrode material. The Chalcogenide material is then deposited over the dielectric material and into the via to contact with the lower electrode material. A top electrode material is then deposited over the Chalcogenide material. Carbon is a commonly used electrode material although other materials, such as molybdenum and titanium nitride, have also been used.

The size of the Chalcogenide active region is primarily defined by the volume of Chalcogenide material that is contained within the via delineated by the opening in the dielectric material. The upper portion of the Chalcogenide material not contained within the via acts as an electrode that in turn contacts with the upper electrode material. The Chalcogenide active region makes contact with the lower electrode at an interface area that is substantially equal to the cross sectional area of the via. As a result of such configuration, the interface area of the Chalcogenide material within the Chalcogenide active region is subjected to the high current density required for the operation of the Chalcogenide memory cell. This is an undesirable situation because the high current density at the interface area of the Chalcogenide active region with the lower electrode causes mixing of the lower electrode material with the Chalcogenide material of the Chalcogenide active region due to heating and electrophoretic effects. More specifically, the mixing of the electrode material with the Chalcogenide material in the Chalcogenide active region causes instability of the Chalcogenide memory cell during operation.

The switching voltages, currents, and powers of a Chalcogenide memory element are believed to be scalable with device size or contact area. With current semiconductor processing technology, the minimum achievable dimension of a contact for a small area Chalcogenide memory device is limited by lithography tools, which is approximately 0.15 um×0.15 um. Such dimension will cause switching currents, voltages, and switching times to be too large and cycle life to be too small for integration with leading edge silicon semiconductor processing. Consequently, it is desirable to provide an improve method for manufacturing smaller contacts for a Chalcogenide memory device.

SUMMARY OF THE INVENTION

In accordance with a preferred embodiment of the present invention, a via is initially formed within a first oxide layer on a substrate. A conductive layer is then deposited on top of the first oxide layer. A second oxide layer is deposited on the conductive layer. Subsequently, the second oxide layer and the conductive layer are then removed such that the remaining portion of conductive layer within the via flushes with a surface of the first oxide layer. A third oxide layer is deposited on the conductive layer, and the first and second oxide layers. A pattern is formed to remove third layer so that the pattern opens orthgonally across and exposes the conductive layer.

Next, a nitride layer is deposited on the third oxide layer, the conductive layer, and the first and second oxide layers. The nitride layer conforms with the contour of the third oxide layer. After directionally removing the nitride layer to form a spacer at the exposed edge of the third oxide layer, the third oxide layer is removed to expose the spacer. The conductive layer is then etched to remove a portion of the conductive layer not underneath the spacer. The portion of the conductive layer underneath the spacer resembles a matchstick. The spacer is then removed to expose the matchstick-like conductive layer portion with a small top surface contact area. A final oxide layer is deposited on the exposed matchstick-like conductor and surrounding oxide layer. A chemical-mechanical polishing process is used to remove the final oxide to a depth that exposes the small top area of the matchstick-like conductor.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
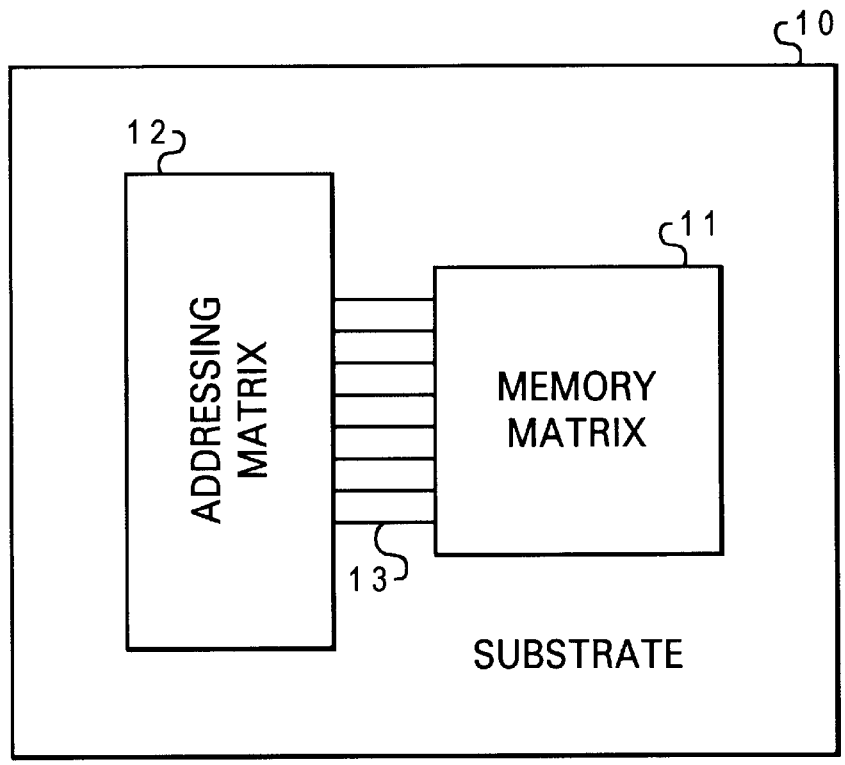
FIG. 1 is a block diagram of a Chalcogenide memory device, in accordance with a preferred embodiment of the present invention.

Referring now to the drawings and in particular to FIG. 1, there is illustrated a block diagram of a Chalcogenide memory device, in accordance with a preferred embodiment of the present invention. As shown, a memory matrix 11 is formed on a substrate 10. Also formed on substrate 10 is an addressing matrix 12 that is suitably connected to memory matrix 11 through connections 13. Addressing matrix 12 preferably includes various signal generating means that control and read pulses applied to memory matrix 11.

Figure 2:
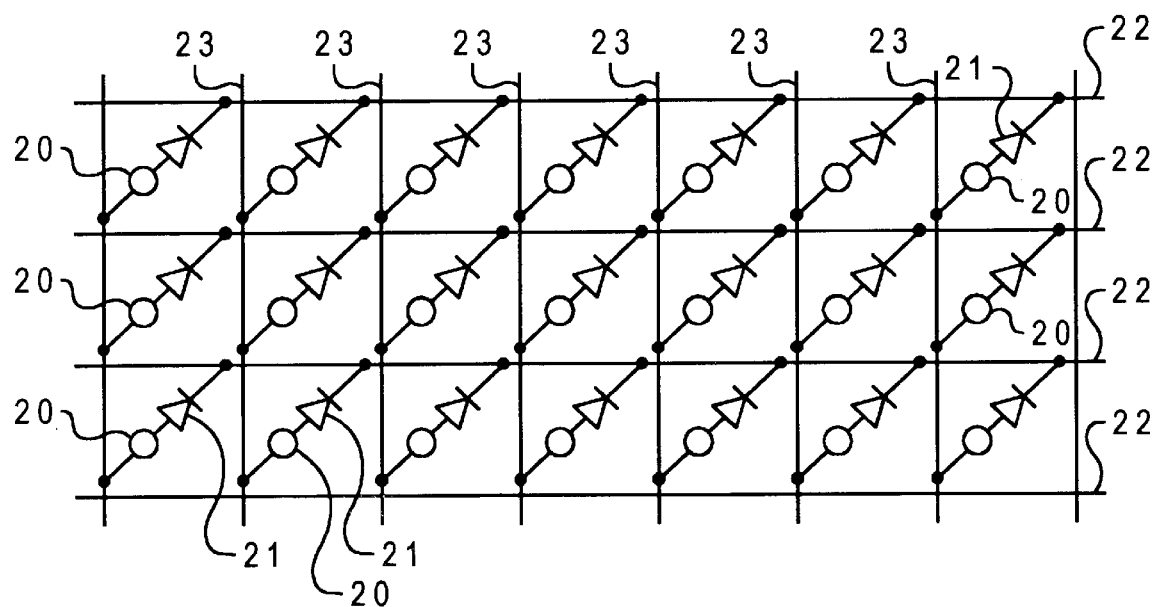
FIG. 2 is a circuit diagram of the memory matrix within the Chalcogenide memory device from FIG. 1, in accordance with a preferred embodiment of the present invention.

With reference now to FIG. 2, there is illustrated a circuit diagram of memory matrix 11, in accordance with a preferred embodiment of the present invention. As shown, memory matrix 11 includes an x-y grid with each of memory cells 20 being connected in series with a diode 21 at the cross points of x address lines 22 and y address lines 23. Address lines 22 and 23 are separately connected to external addressing circuitry, such as addressing matrix 12 from FIG. 1, in a manner that is well-known in the art.

Figure 3A:
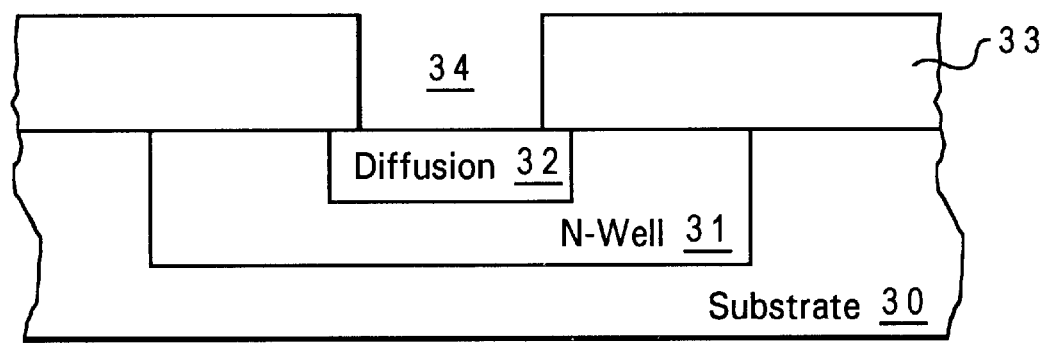
FIGS. 3a–3l are pictorial representations of a process for making a small contact within the Chalcogenide memory device from FIG. 1, in accordance with a preferred embodiment of the present invention.

In order to manufacture a small contact within a memory cell 20 from FIG. 2, an N-well 31 is first formed within a single crystal P-doped silicon substrate 30 by diffusion in a manner well-known in the art. An P+ diffusion 32 is then formed within N-well 31 using well-known masking and doping techniques. Next, a silicon dioxide ($SiO_2$) layer 33 is deposited on top of substrate 30. A contact or via 34 is formed, using well-known masking and etching techniques, within silicon dioxide layer 33, as shown in FIG. 3a.

Figure 3B:
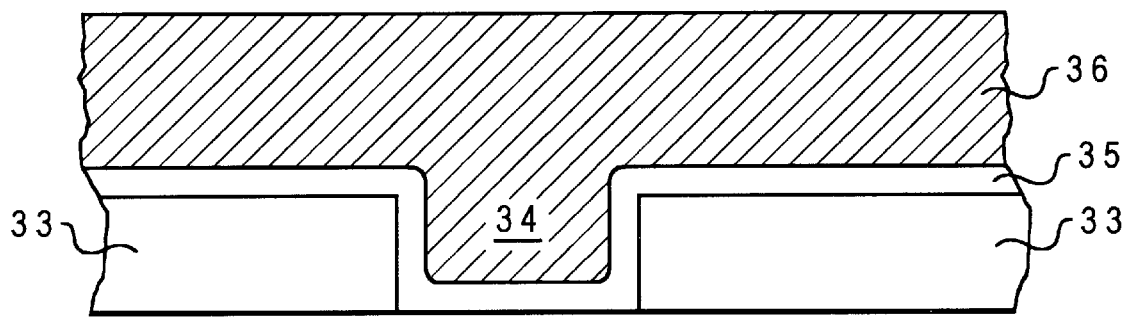

A metal layer 35 is then deposited over silicon dioxide layer 33 via a chemical-vapor deposition (CVD) process. Metal layer 35 can be metal or polysilicon with a thickness of approximately 300 Å. Afterwards, a second silicon dioxide layer 36 is deposited over metal layer 35, filling contact 34, as depicted in FIG. 3b.

Figure 3C:
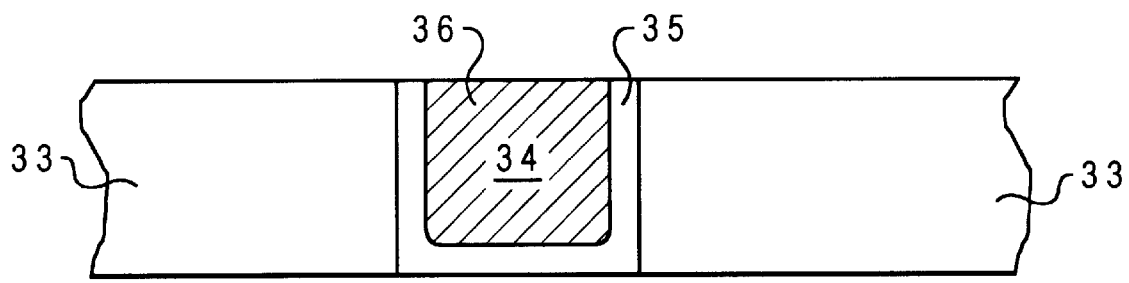

A chemical mechanical polishing (CMP) process is then utilized to remove silicon dioxide layer 36 and metal layer 35 such that the remaining portion of metal layer 35 within contact 34 flushes with the surface of silicon dioxide layer 33, as illustrated in FIG. 3c. At this point, the remaining portion of metal layer 35 within contact 34 resembles a ring if view from the top. The cross-section view of the remaining portion of metal layer 35 within contact 34, as shown in FIG. 3c, resembles a "cup." Thus, for the convenience of naming, the remaining portion of metal layer 35 within contact 34 is hereon referred to as cup conductor 35.

Figure 3D:
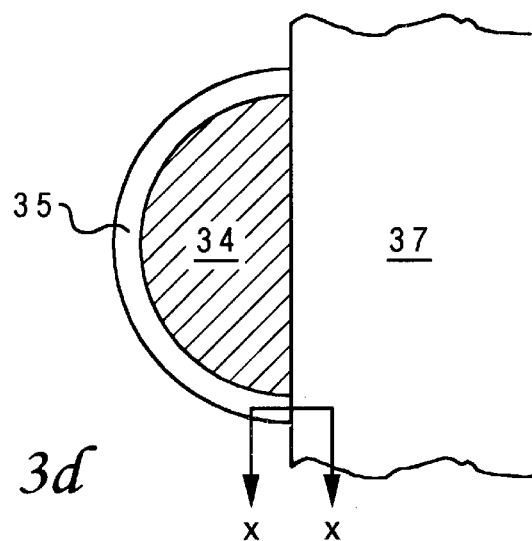
Figure 3E:
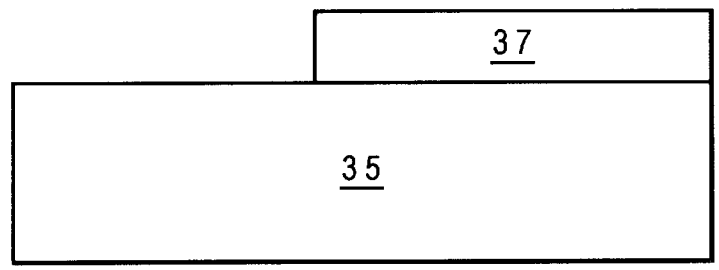

A third silicon oxide layer 37, preferably 50 nm–100 nm thick, is then deposited on top of silicon dioxide layer 33 and cup conductor 35. A photomask and etch process is employed to remove a portion of layer 34 such that the remaining layer 37 covers approximately half of contact 34. FIG. 3d is a top view of contact 34 illustrating half of contact 34 is covered by third silicon oxide layer 37. The cross-sectional view along line X—X in FIG. 3d is depicted in FIG. 3e.

Figure 3F:
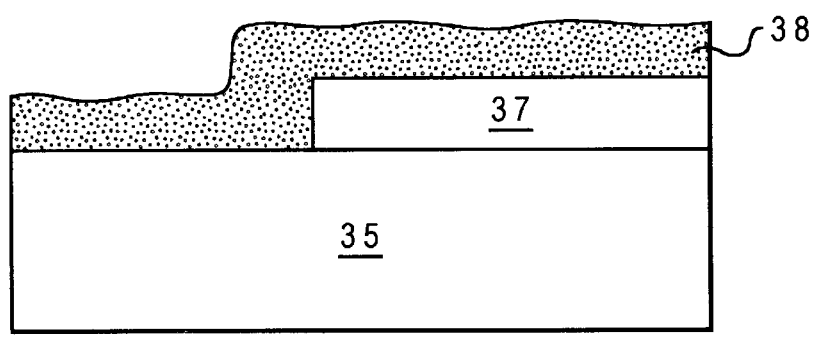
Figure 3G:
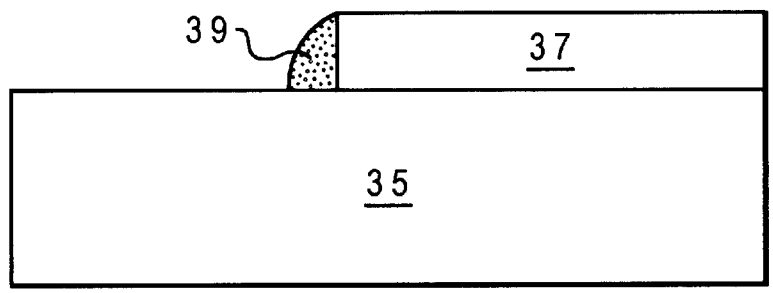

Next, a silicon nitride ($Si_3N_4$) layer 38, preferably 20 nm–30 nm thick, is deposited conformably on top of silicon dioxide layer 37 and cup conductor 35 (and also silicon dioxide layer 33) via a CVD process, as depicted in FIG. 3f. Silicon nitride layer 38 is then removed from the top of silicon dioxide layer 37 and cup conductor 35 (and also silicon dioxide layer 33) using a directional etch process such as a reactive ion etching (RIE) process. A sidewall spacer of silicon nitride remains in every location at which a step has occurred in silicon dioxide layer 37, formed by the photomask and etch operation. As shown in FIG. 3g, a spacer 39 is formed at an edge of silicon dioxide layer 37 after the RIE process.

Figure 3H:
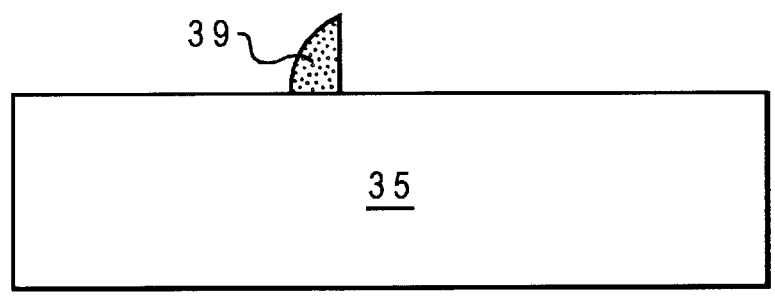

An additional oxide etch is then performed to remove the remaining portion of silicon dioxide layer 37 adjacent to spacer 39. The exposed portion of oxide layers 33 and 34 are also etched. As a result, sidewall 39 and cup conductor 35 are exposed, resembling an "ear," as depicted in FIG. 3h. Spacer 39 is now free standing, straddling on top of cup conductor 35.

Figure 3I:
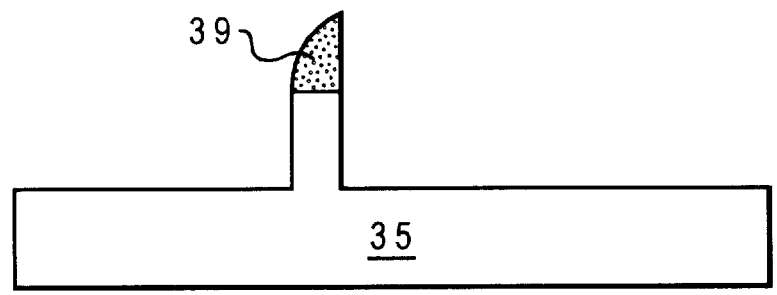

Next, approximately 50 nm–100 nm of cup conductor 35 is etched back to expose the original portion of cup conductor 35 under the sidewall nitride, as shown in FIG. 3i. The etching is achieved using a directional or RIE etch process.

Figure 3J:
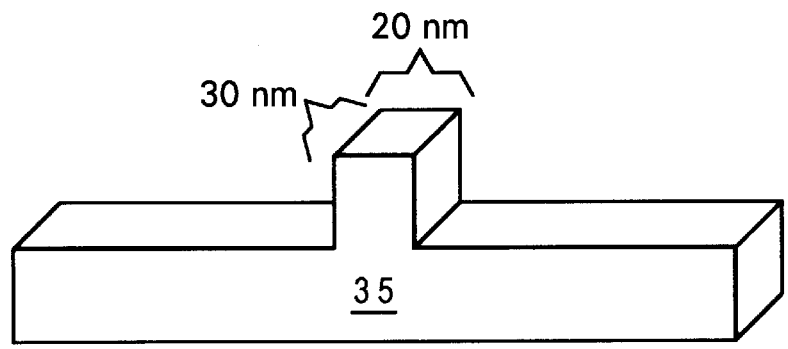

Spacer 39 is then removed, and an extension of cup conductor 35 is exposed as a sidewall rapier contact having a dimension of the width of cup conductor 35 times the thickness of spacer 39. In this example, the width of cup conductor 35 is 30 nm and the thickness of spacer 39 is 20 nm, as shown in a perspective view of FIG. 3j.

Figure 3K:
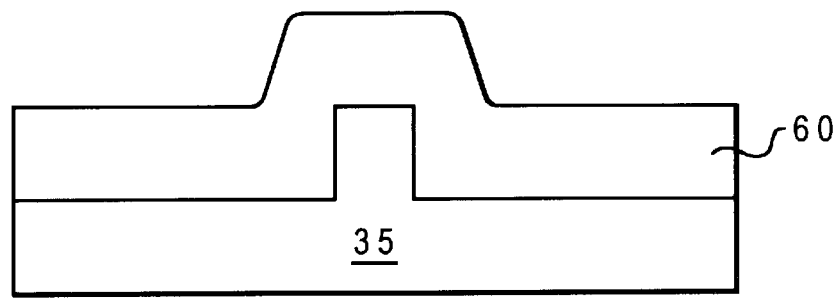
Figure 3L:
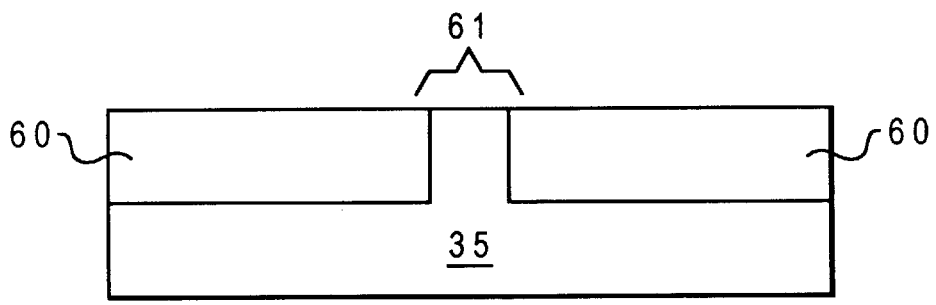

A silicon oxide layer 60, preferably 200 nm–250 nm thick, is then deposited on top of cup conductor 35, conformably covering the matchstick portion of cup conductor 35, as shown in FIG. 3k. Silicon oxide layer 60 is subsequently chemical mechanical polished back to the top of the matchstick portion of cup conductor 35, as illustrated in FIG. 3l. A 30 nm×20 nm contact area 61 is now formed upon which Chalcogenide and contact metallurgy can be deposited.

Figure 4:
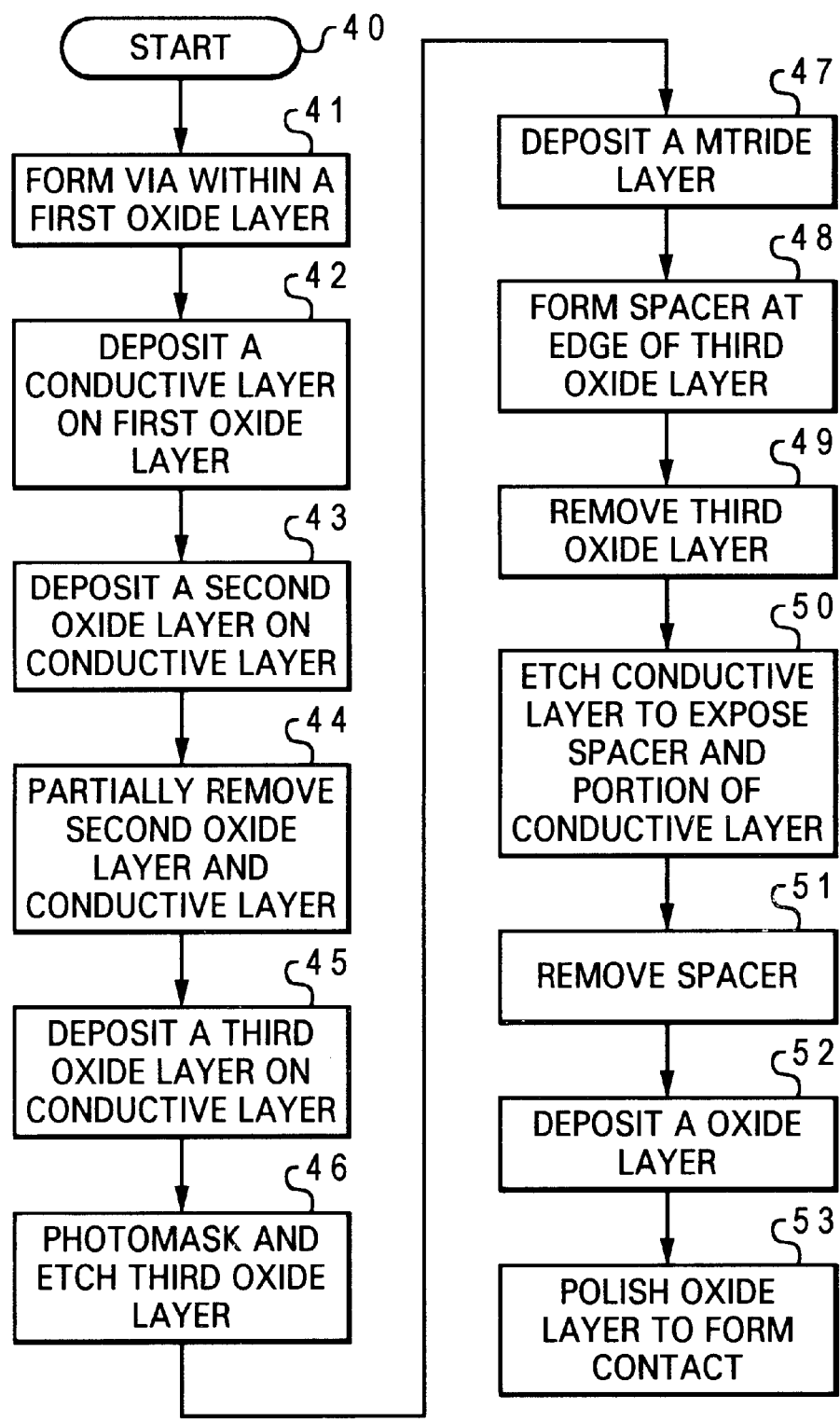
FIG. 4 is a high-level process flow diagram of a method for manufacturing the small contact from FIGS. 3a–3l, in accordance with a preferred embodiment of the present invention.

With reference now to FIG. 4, there is depicted a high-level process flow diagram of a method for manufacturing the contact from FIGS. 3a–3l, in accordance with a preferred embodiment of the present invention. Starting at block 40, a via is initially formed within a first oxide layer on a substrate, as shown in block 41. A conductive layer is then deposited on top of the first oxide layer, as depicted in block 42. A second oxide layer is deposited on the conductive layer, as shown in block 43. Subsequently, the second oxide layer and the conductive layer are then removed, as depicted in block 44, such that the remaining portion of conductive layer within the via flushes with a surface of the first oxide layer. A third oxide layer is deposited on the conductive layer, and the first and second oxide layers, as shown in block 45.

A photomask and etch process are used to pattern an edge in the third oxide layer, so that the edge of the third oxide layer falls in a perpendicular manner across the conductive layer, as shown in 46. Next, a nitride layer is deposited on the third oxide layer, the conductive layer, and the first and second oxide layers, as depicted in block 47. The nitride layer conforms with the contour of the third oxide layer. After directionally removing the nitride layer to form a spacer at an edge of the third oxide layer, as shown in block 48, the third oxide layer is removed to expose the spacer, as depicted in block 49. The conductive layer is then etched to expose a portion of the conductive layer underneath the spacer, as shown in block 50. The portion of the conductive layer underneath the spacer resembles a matchstick. Next, the spacer is removed to expose the matchstick-like conductive layer portion, as depicted in block 51. Subsequently, an oxide layer is deposited on top of the conductive layer, conforming with the contour of the matchstick-like conductive layer portion, as shown in block 52. Finally, the oxide layer is chemical mechanical polished back to the top of the matchstick-like conductive layer portion to form a small contact, as depicted in block 53.

As has been described, the present invention provides an improved method for manufacturing contacts for a Chalcogenide memory device. Formation of a Chalcogenide memory element having a minimum cross-section area will provide lower switching voltages, currents, and switching times, longer cycle life, and better overall parameter control. The present invention uses a spacer technology approach, along with a poly or metal stick structure to form a sub-lithographic minimum memory cell. As a result, the cell contact area size is reduced to the width of the stick material times the thickness of the spacer. With the current processing technology, those dimensions should be approximately 30 nm×30 nm, or smaller.

While the invention has been particularly shown and described with reference to a preferred embodiment, it will be understood by those skilled in the art that various changes in form and detail may be made therein without departing from the spirit and scope of the invention.

What is claimed is:

1. A method for manufacturing a small contact for a Chalcogenide memory device, said method comprising:

forming a via within a first oxide layer on a substrate;

depositing a conductive layer on top of said first oxide layer;

depositing a second oxide layer on said conductive layer;

removing said second oxide layer and said conductive layer such that the remaining portion of conductive layer within said contact is flush with a surface of said first oxide layer;

depositing a third oxide layer on said conductive layer, and said first and second oxide layers;

removing a portion of said third oxide layer to leave an edge of said third oxide layer essentially perpendicular to said conductive layer;

depositing a nitride layer on said third oxide layer, said conductive layer, and said first and second oxide layers, wherein said nitride layer conforms with said third oxide layer;

removing said nitride layer to form a spacer at an edge of said third oxide layer;

removing said third oxide layer to expose said spacer;

etching said conductive layer such that a portion of said conductive layer underneath said spacer is exposed, wherein said portion of said conductive layer underneath said spacer resembles a matchstick; and removing said spacer to expose said matchstick-like conductive layer portion as a small contact.

2. The method according to claim 1, wherein said conductive layer is a metal layer.

3. The method according to claim 1, wherein said conductive layer is a polysilicon layer.

4. The method according to claim 1, wherein said conductive layer is approximately 300 Å thick.

5. The method according to claim 1, wherein said third oxide layer is approximately 50–100 nm thick.

6. The method according to claim 1, wherein said nitride layer is approximately 20–30 nm thick.

7. The method according to claim 1, wherein said etching includes etching said conductive layer back 50–100 nm such that a portion of said conductive layer underneath said spacer is exposed.

8. The method according to claim 1, wherein a width of said portion of said conductive layer is 30 nm and a length of said portion of said conductive layer is 20 nm.

9. The method according to claim 1, wherein said method further include:

depositing an oxide layer conformably over said matchstick conductive layer portion; and polishing said oxide layer to expose said matchstick-like conductive layer portion as said small contact.

10. The method according to claim 9, wherein said oxide layer is silicon oxide layer.

11. The method according to claim 9, wherein said oxide layer is approximately 200–250 nm thick.

\* \* \* \* \*